(12) United States Patent
Baik et al.

(10) Patent No.: US 11,817,625 B2
(45) Date of Patent: Nov. 14, 2023

(54) ELECTROMAGNETIC WAVE RADIATOR

(71) Applicants: SAMSUNG ELECTRONICS CO., LTD., Suwon-si (KR); THE REGENTS OF THE UNIVERSITY OF CALIFORNIA, Irvine, CA (US)

(72) Inventors: Chanwook Baik, Seoul (KR); Payam Heydari, Irvine, CA (US); Peyman Nazari, Irvine, CA (US)

(73) Assignees: SAMSUNG ELECTRONICS CO., LTD., Suwon-si (KR); THE REGENTS OF THE UNIVERSITY OF CALIFORNIA, Irvine, CA (US)

(*) Notice: Subject to any disclaimer, the term of this patent is extended or adjusted under 35 U.S.C. 154(b) by 0 days.

(21) Appl. No.: 17/708,963

(22) Filed: Mar. 30, 2022

(65) Prior Publication Data
US 2022/0224016 A1    Jul. 14, 2022

Related U.S. Application Data

(63) Continuation of application No. 16/805,091, filed on Feb. 28, 2020, now Pat. No. 11,316,275, which is a
(Continued)

(30) Foreign Application Priority Data

Mar. 16, 2017    (KR) .................... 10-2017-0033205

(51) Int. Cl.
| | | |
|---|---|---|
| *H01Q 13/18* | (2006.01) | |
| *H01Q 3/44* | (2006.01) | |
| *H01Q 13/12* | (2006.01) | |
| *H01Q 21/20* | (2006.01) | |
| *H03F 3/19* | (2006.01) | |
| *H03F 3/60* | (2006.01) | |
| *H01Q 3/34* | (2006.01) | |
| *H01P 5/00* | (2006.01) | |

(52) U.S. Cl.
CPC ............... *H01Q 13/18* (2013.01); *H01Q 3/34* (2013.01); *H01Q 3/443* (2013.01); *H01Q 13/12* (2013.01);
(Continued)

(58) Field of Classification Search
CPC .. H01Q 9/0414; H01Q 13/18; H01Q 21/0012; H01Q 21/0031; H01Q 21/205
See application file for complete search history.

(56) References Cited

U.S. PATENT DOCUMENTS

| | | |
|---|---|---|
| 3,022,506 A | 2/1962 | Goebels |
| 9,000,851 B1 | 1/2015 | Oran |

(Continued)

OTHER PUBLICATIONS

Amirreza Safaripour et al., "Dynamic Polarization Control of Two-Dimensional Integrated Phased Arrays", IEEE Transactions on Microwave Theory and Techniques, vol. 64, No. 4, Apr. 2016, pp. 1066-1077. (12 pages total).

(Continued)

*Primary Examiner* — Daniel Munoz
(74) *Attorney, Agent, or Firm* — Sughrue Mion, PLLC

(57) ABSTRACT

An electromagnetic wave radiator may include: a first metal layer; a plurality of metal side walls vertically protruding along an edge of the first metal layer; and a second metal layer suspended over the first metal layer. The second metal layer includes a plurality of ports radially extending from edges of the second metal layer and a plurality of slots penetrating the second metal layer in a radial direction.

22 Claims, 17 Drawing Sheets

Related U.S. Application Data continuation of application No. 15/875,526, filed on Jan. 19, 2018, now Pat. No. 10,601,140.

(60) Provisional application No. 62/447,963, filed on Jan. 19, 2017.

(52) U.S. Cl.
CPC ............ *H01Q 21/205* (2013.01); *H03F 3/19* (2013.01); *H03F 3/60* (2013.01); *H01P 5/00* (2013.01); *H03F 2200/222* (2013.01); *H03F 2200/318* (2013.01); *H03F 2200/387* (2013.01); *H03F 2200/451* (2013.01)

(56) References Cited

U.S. PATENT DOCUMENTS

| | | | |
|---|---|---|---|
| 9,344,308 | B2 | 5/2016 | Han et al. |
| 9,413,070 | B2 | 8/2016 | Lee |
| 2006/0007044 | A1 | 1/2006 | Crouch |
| 2006/0170492 | A1 | 8/2006 | Sheng-Fuh |
| 2012/0068892 | A1 | 3/2012 | Shtrom |
| 2012/0249392 | A1 | 10/2012 | Wang |
| 2013/0069743 | A1 | 3/2013 | Matters-Kammerer et al. |
| 2013/0141296 | A1 | 6/2013 | Jaffri et al. |
| 2013/0193324 | A1 | 8/2013 | Sengupta et al. |
| 2014/0218237 | A1 | 8/2014 | Boutayeb |
| 2014/0367575 | A1 | 12/2014 | Sengupta et al. |
| 2016/0336660 | A1 | 11/2016 | Bowers et al. |
| 2018/0108991 | A1* | 4/2018 | Klemes ................ H01Q 21/067 |

OTHER PUBLICATIONS

Steven M. Bowers et al., "An Integrated Slot-Ring Traveling-Wave Radiator", IEE Transactions on Microwave Theory and Techniques, vol. 63, No. 4, Apr. 2015, pp. 1154-1162. (9 pages total).

Steven M. Bowers et al., "Multi-Port Driven Radiators", IEEE Transactions on Microwave Theory and Techniques, vol. 61, No. 12, Dec. 2013, pp. 4428-4441. (14 pages total).

* cited by examiner n = 4 n = 5

ELECTROMAGNETIC WAVE RADIATOR

CROSS-REFERENCE TO RELATED APPLICATIONS

This application is a continuation of U.S. patent application Ser. No. 16/805,091, filed Feb. 28, 2020, which is a continuation of U.S. patent application Ser. No. 15/875,526, filed on Jan. 19, 2018, now U.S. Pat. No., issued Mar. 24, 2020, which claims priority from U.S. Provisional Patent Application No. 62/447,963, filed on Jan. 19, 2017, in the U.S. Patent and Trademark Office, and Korean Patent Application No. 10-2017-0033205, filed on Mar. 16, 2017, in the Korean Intellectual Property Office, the disclosures of which are incorporated herein in their entireties by reference.

BACKGROUND

1. Field

The present disclosure relates to an electromagnetic wave radiator, and more particularly, to an electromagnetic wave radiator radiating a circularly-polarized millimeter-wave/terahertz (THz)-wave.

2. Description of the Related Art

A millimeter-wave is an electromagnetic wave having a wavelength of about 1 to about 10 millimeters and has a frequency of about 30 to about 300 GHz. The millimeter-wave is used in various fields such as the military and automobile radars, satellite communication, and radio navigation, and is expected to be used for large-capacity voice, image, and data transmission in the next generation 5G ultra-wideband mobile communication network. A terahertz (THz)-wave is an electromagnetic wave having a frequency of about 0.3 to about 3 THz, which is used for security and medical purposes, and is expected to be widely used in the future.

Accordingly, various devices for efficiently transmitting and receiving millimeter-waves and THz-waves are being developed. For example, a millimeter-wave/THz-wave microstrip patch antenna has a large area and a low quality factor (Q-factor). In order to improve this issue, devices such as a multi-port driven antenna, a slot-ring traveling-wave radiator, and a multi-port driven antenna having a radiator core are proposed for the millimeter-wave/THz-wave. However, these devices still do not provide high-enough Q-factors.

SUMMARY

Additional aspects will be set forth in part in the description which follows and, in part, will be apparent from the description, or may be learned by practice of the presented example embodiments.

According to an aspect of an example embodiment, an electromagnetic wave radiator may include: a first metal layer; a plurality of metal side walls vertically protruding along an edge of the first metal layer; and a second metal layer suspended over the first metal layer. The second metal layer may include a plurality of ports extending radially from edges of the second metal layer and a plurality of slots penetrating the second metal layer in a radial direction.

Every pair of adjacent metal side walls of the plurality of metal side walls may be spaced apart from each other, and each port of the plurality of ports may be disposed to pass through a gap between a corresponding pair of adjacent metal side walls.

The first metal layer and the second metal layer may have an identical regular polygonal shape. Each metal side wall of the plurality of metal side walls may be disposed perpendicular to an upper surface of the first metal layer at the edge of one side of the identical regular polygonal shape of the first metal layer. A first length of the each metal side wall of the plurality of metal side walls may be less than a second length of the one side of the first metal layer. A gap between two adjacent metal side walls may be disposed at a vertex of the identical regular polygonal shape of the first metal layer.

The plurality of ports may radially protrude from respective vertices of the identical regular polygonal shape of the second metal layer, and the plurality of slots may be disposed between a center of the second metal layer and the respective vertices of the identical regular polygonal shape of the second metal layer.

The first metal layer and the second metal layer may have an identical circular shape. Each metal side wall of the plurality of metal side walls may be disposed perpendicular to an upper surface of the first metal layer at the edge of the first metal layer. The edge of the first metal layer may correspond to a perimeter of the identical circular shape of the first metal layer. A combined length of the plurality of metal side walls may be less than a diameter of the identical circular shape of the first metal layer. The plurality of gaps between the plurality of metal side walls may be disposed at regular intervals along the perimeter of the identical circular shape of the first metal layer.

Each of the plurality of ports may protrude in the radial direction of the second metal layer between the plurality of gaps between the plurality of metal side walls.

The second metal layer may be in a space surrounded by the plurality of metal side walls.

The second metal layer may further include an opening penetrating through a central region of the second metal layer.

The electromagnetic wave radiator may further include at least one oscillator configured to provide a signal to each of the plurality of ports. The at least one oscillator may be configured so that signals provided to the plurality of ports have an identical amplitude and different phases from each other, and phase differences between signals applied to two adjacent ports are identical.

The second metal layer may have n ports, and a phase of the signal applied to an m-th port may be $2m\pi/n$, where n is a natural number and m is 0, 1, . . . , n−1.

The at least one oscillator may be connected to the plurality of ports in a one-to-one manner.

One oscillator of the at least one oscillator may be connected to the plurality of ports via a plurality of wires and each of the plurality of wires may have an electrical length providing a different phase delay from each other.

A space surrounded by the first metal layer, the plurality of metal side walls, and the second metal layer may define a cavity for resonance of an electromagnetic wave, and the first metal layer, the plurality of metal side walls, and the second metal layer may be configured so that the cavity functions as a resonator, a power combiner, and a radiator.

The electromagnetic wave radiator may further include a plurality of amplification circuits between two adjacent ports. of the plurality of ports. The plurality of amplification circuits may be disposed in a loop shape between the plurality of ports.

Each of the plurality of amplification circuits may include an input matching unit, an inter-stage matching unit, an output matching unit, a first common emitter transistor between the input matching unit and the inter-stage matching unit, and a second common emitter transistor between the inter-stage matching unit and the output matching unit.

The first common emitter transistor and the second common emitter transistor may have an identical voltage gain.

Each of the port impedances for the plurality of ports may be identical to each other, and port admittances for the plurality of ports may be identical to each other.

Each of the port admittances may have a negative resistance offsetting a cavity load impedance at a resonant frequency, and a total admittance of the electromagnetic wave radiator may have a negative real part at the resonant frequency.

The electromagnetic wave radiator may be configured to radiate a circularly-polarized millimeter-wave/terahertz (THz) wave.

According to an aspect of an example embodiment, an electromagnetic wave radiator array may include a plurality of two-dimensionally arranged electromagnetic wave radiators. Each electromagnetic wave radiator of the plurality of two-dimensionally arranged electromagnetic wave radiators may include: a first metal layer; a plurality of metal side walls vertically protruding along a edge of the first metal layer; and a second metal layer suspended over the first metal layer, wherein the second metal layer includes a plurality of ports radially extending from the edge of the second metal layer and a plurality of slots penetrating the second metal layer in a radial direction.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
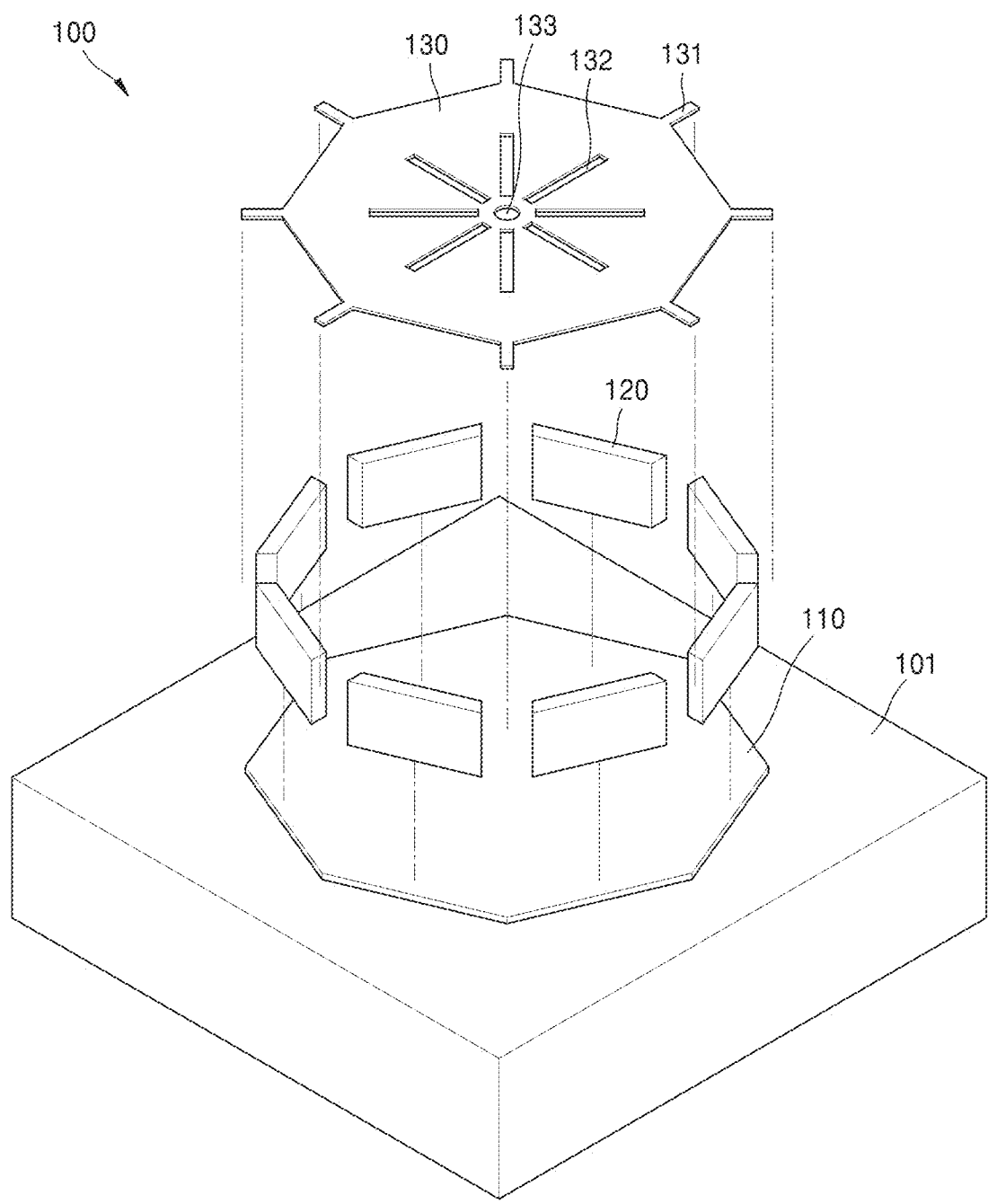
FIG. 1 is an exploded perspective view of an electromagnetic wave radiator according to an example embodiment.

In the following drawings, like reference numerals in the drawings denote like elements, and sizes of elements may be exaggerated for clarity and convenience. In addition, embodiments to be described below are only exemplary and various modifications from such example embodiments may be possible. In the case where a position relationship between two items is described with the terms "on" or "on the top of," one item may be not only directly on the other item while being in contact with the other item but may also be on the other item without being in contact with the other item.

FIG. 1 is an exploded perspective view of an electromagnetic wave radiator according to an example embodiment. Referring to FIG. 1, an electromagnetic wave radiator 100 according to an example embodiment may include a first metal layer 110 on a semiconductor substrate 101, a plurality of side walls 120 vertically protruding along edges of the first metal layer 110, and a second metal layer 130 suspended over the first metal layer 110. The semiconductor substrate 101 may include a material for a general semiconductor device such as silicon or a compound semiconductor. Although not shown, a circuit for transmitting and receiving signals to and from the electromagnetic wave radiator 100 may be formed on the semiconductor substrate 101. A supporting member for supporting the second metal layer 130 so as to be suspended with respect to the first metal layer 110 may be arranged on the semiconductor substrate 101.

The first metal layer 110 may be a thin and flat metal plate and be disposed on the semiconductor substrate 101. For example, a thickness of the first metal layer 110 may be in a range of about 0.3 to about 0.6 μm and have a diameter in a range of about 1 to about 2 mm. In addition, the first metal layer 110 may have a circular or regular polygonal shape. In FIG. 1, the first metal layer 110 is illustrated to have a regular octagonal shape. However, the example embodiment is not limited thereto. The first metal layer 110 may have a different shape depending on the number of phases of signals to be coupled.

The plurality of side walls 120 may include the same conductive metal as the first metal layer 110. When the first metal layer 110 has a regular polygonal shape, each side wall 120 may be perpendicular to an upper surface of the first metal layer 110 at an edge of one side of the first metal layer 110. For example, a height of each side wall 120 may be in a range of about 12 to about 16 μm. A width of each side wall 120 may be less than the length of one side of the first metal layer 110 so that a gap may be formed between two adjacent side walls 120. For example, the gap between two adjacent side walls 120 may be at each vertex of the first metal layer 110. Alternatively, when the first metal layer 110 has a circular shape, the combined widths of the side walls 120 may be less than a diameter of the first metal layer 110, and a plurality of gaps among a plurality of side walls 120 may be equally located along the perimeter of the first metal layer 110.

The second metal layer 130 may include a thin and flat metal plate and may include the same conductive metal as the first metal layer 110. For example, a thickness of the second metal layer 130 may be in a range of about 2 to about 4 μm. In addition, the second metal layer 130 may have the same circular or regular polygonal (e.g., equilateral) shape as the first metal layer 110. A size or diameter of the second metal layer 130 may be less than the size or diameter of the first metal layer 110 so that the second metal layer 130 may be disposed in a space surrounded by the plurality of side walls 120. As described above, the second metal layer 130 may be suspended on the first metal layer 110 by the supporting member on the semiconductor substrate 101. The distance between the first metal layer 110 and the second metal layer 130 may be slightly less than a height of the side wall 120.

In addition, the second metal layer 130 may include a plurality of ports 131 protruding radially from edges of the second metal layer 130, a plurality of slots 132 between the center and each of the vertices of the second metal layer 130, and an opening 133 at the center of the second metal layer 130. The plurality of ports 131 may receive signals from an oscillator 150 (refer to FIGS. 12A and 12B) to be described below and the signals generated from the oscillator 150 may be provided to the electromagnetic wave radiator 100 via the plurality of ports 131. Each port 131 may extend from the each vertex of the second metal layer 130 and may protrude out of the first metal layer 110 through the gap between two adjacent side walls 120. Each slot 132 formed by partial penetration through the second metal layer 130 may be formed to extend in a radial direction between the center and each vertex of the second metal layer 130. Electromagnetic waves radiated from the electromagnetic wave radiator 100 may be radiated through respective slots 132. In addition, the circular opening 133 formed by partial penetration through a central region of the second metal layer 130 may suppress noise. The electromagnetic wave radiator 100 may have a radially symmetric structure, and a cavity for resonating an electromagnetic wave, particularly a millimeter-wave/terahertz (THz)-wave, may be prepared inside a space surrounded by the first metal layer 110, the plurality of side walls 120, and the second metal layer 130.

Figure 2:
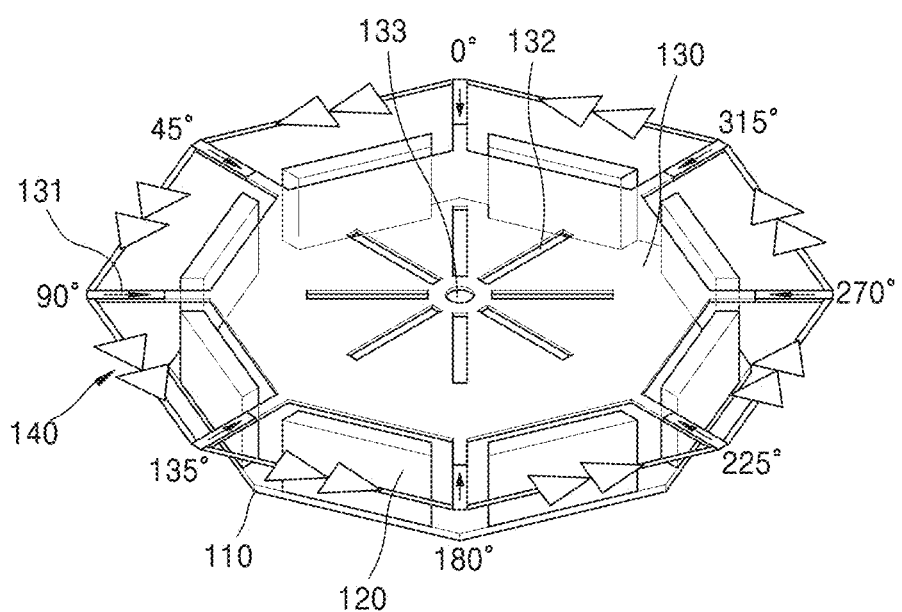
FIG. 2 is a perspective view of an electromagnetic wave radiator and illustrates a phase of a signal applied to each port of the electromagnetic wave radiator according to an example embodiment.

FIG. 2 is a perspective view of an electromagnetic wave radiator according to an example embodiment of the present disclosure and illustrates a phase of a signal applied to each port of the electromagnetic wave radiator. Referring to FIG. 2, an amplification circuit 140, which is two-staged, may be between two adjacent ports 131. A plurality of amplification circuits 140 may be arranged between the ports 131 of the entire electromagnetic wave radiator 100 in a loop shape. In addition, signals having evenly spaced phases may be respectively applied to the plurality of ports 131 of the electromagnetic wave radiator 100. In other words, phase differences between the signals applied to the two adjacent ports 131 in the electromagnetic wave radiator 100 may be all the same. For example, when the electromagnetic wave radiator 100 has eight ports 131, a signal having a phase of about 0° may be applied to the port 131 at the 12 o'clock direction and, in a counter-clockwise direction, signals having phases of about 45°, about 90°, about 135°, about 180°, about 225°, about 270°, and about 315° may be respectively applied to the ports 131.

Signals having evenly spaced phases applied via the plurality of ports 131 may resonate in the cavity defined by the first metal layer 110, the plurality of side walls 120, and the second metal layer 130. In other words, the electromagnetic wave radiator 100 may be excited by signals having evenly spaced phases applied via the plurality of ports 131. Then, signals applied via the plurality of ports 131 may be combined in the cavity. The cavity may store a significant amount of electromagnetic wave energy by confining the electromagnetic wave therein. Thereafter, the electromagnetic wave corresponding to a resonance frequency may be radiated to the outside via the plurality of slots 132. The electromagnetic wave radiator 100 according to the present example embodiment may function as a slot antenna, a resonant tank, a power combining network, as well as a radiator. Thus, since it is not necessary to use a separate coupling network or an antenna buffer, the size of the electromagnetic wave radiator 100 may be manufactured to be very small; thereby downsizing of a millimeter-wave/THz-wave transceiver may be possible.

Since the signals having evenly spaced phases are combined, the circularly-polarized signal may be radiated from the electromagnetic wave radiator 100 according to the present example embodiment. In addition, since signals having the evenly spaced phases are radiated after having resonated in the cavity, the circularly-polarized signal may be radiated without leakage in the substrate and consequently, elements such as such as a silicon lens may not be needed. In addition, since the electromagnetic wave is distributed in a large confined area in the cavity, a cavity resonance may improve a quality factor (Q-factor). The quality factor (Q-factor) is a parameter that describes how underdamped an oscillator or resonator is, and characterizes a resonator's bandwidth relative to its center frequency. As a result, conductive loss may be reduced by lowering the current density of the signals applied to the electromagnetic wave radiator 100. In addition, low phase noise (or phase noise) and high efficiency oscillation may be achieved by high Q-factors.

Figure 3:
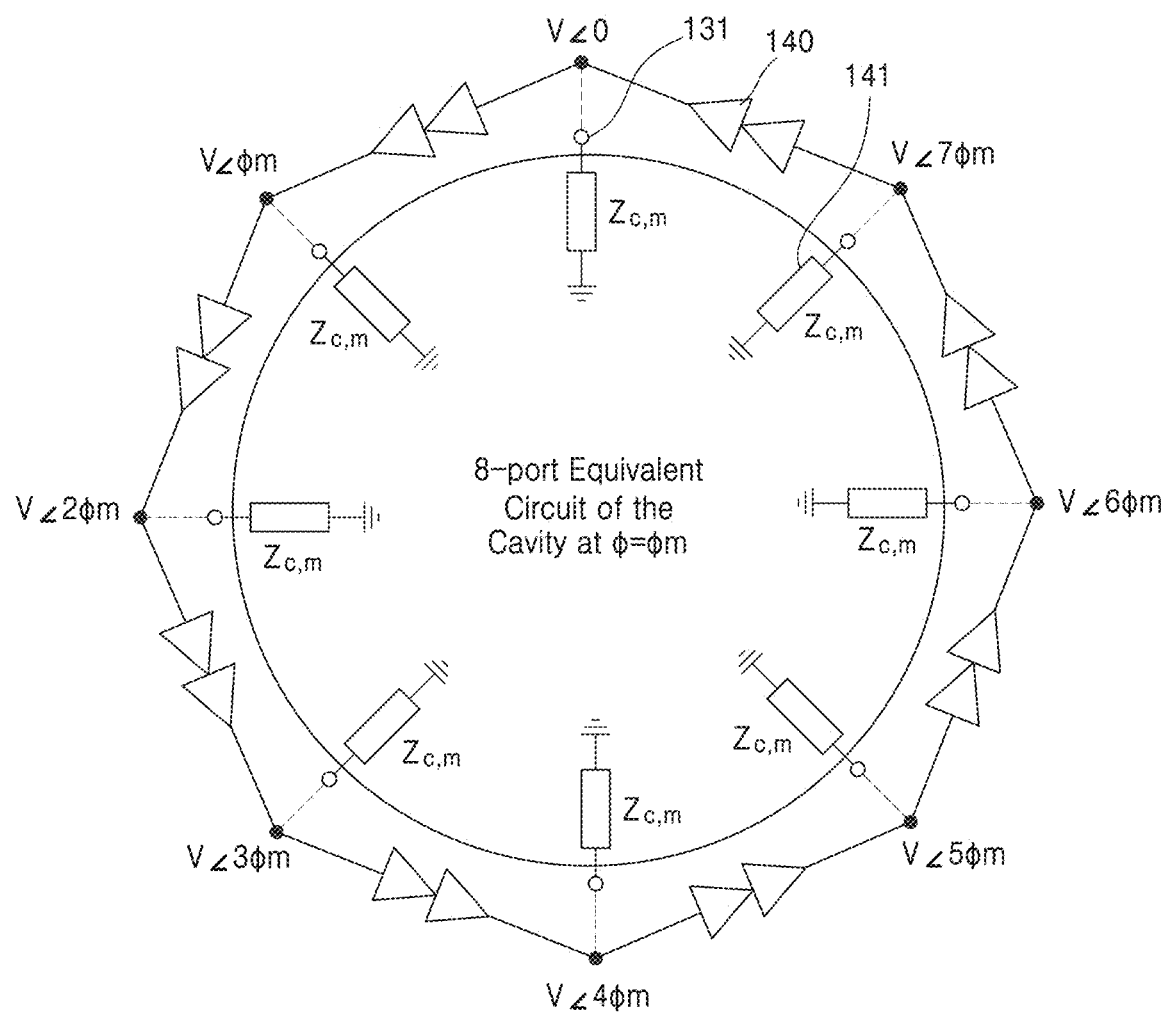
FIG. 3 illustrates an equivalent circuit of an electromagnetic wave radiator according to an example embodiment.

FIG. 3 illustrates an equivalent circuit of an electromagnetic wave radiator 100 according to an example embodiment. Referring to FIG. 3, amplification circuits 140 may be arranged in a loop shape between the ports 131 of the entire electromagnetic wave radiator 100 and a resonance circuit 141 may be disposed at each port 131. As shown in FIG. 3, the electromagnetic wave radiator 100 may have a rotationally symmetrical cavity structure. Signals applied to the plurality of ports 131 of the electromagnetic wave radiator 100 may have the evenly spaced phases like a steady-state oscillation and all the signals may have the same amplitude. In this configuration, port impedance at all ports 131 of the electromagnetic wave radiator 100 may be the same.

Figure 4:
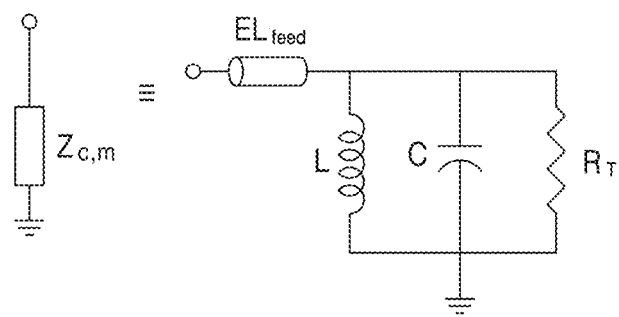
FIG. 4 illustrates an equivalent circuit of a resonance circuit at one port of the electromagnetic wave radiator.

FIG. 4 illustrates an equivalent circuit of a resonance circuit at one port 131 of the electromagnetic wave radiator 100. Values of a coil L, a capacitor C, and a resistor $R_T$ in the equivalent circuit, illustrated as an RLC parallel resonance circuit, of FIG. 4 may be determined by various factors such as sizes and thicknesses of the first metal layer 110, the side wall 120, and the second metal layer 130, and a gap between the first metal layer 110 and the second metal layer 130 and a length of the slot 131, and may be appropriately selected in accordance with an oscillation frequency of the electromagnetic wave radiator 100. For example, when L is about 1.44 pH, C is about 1.31 pF, and $R_T$ is about 40Ω, the oscillation frequency of the electromagnetic wave radiator 100 may be about 116 GHz.

Figure 5:
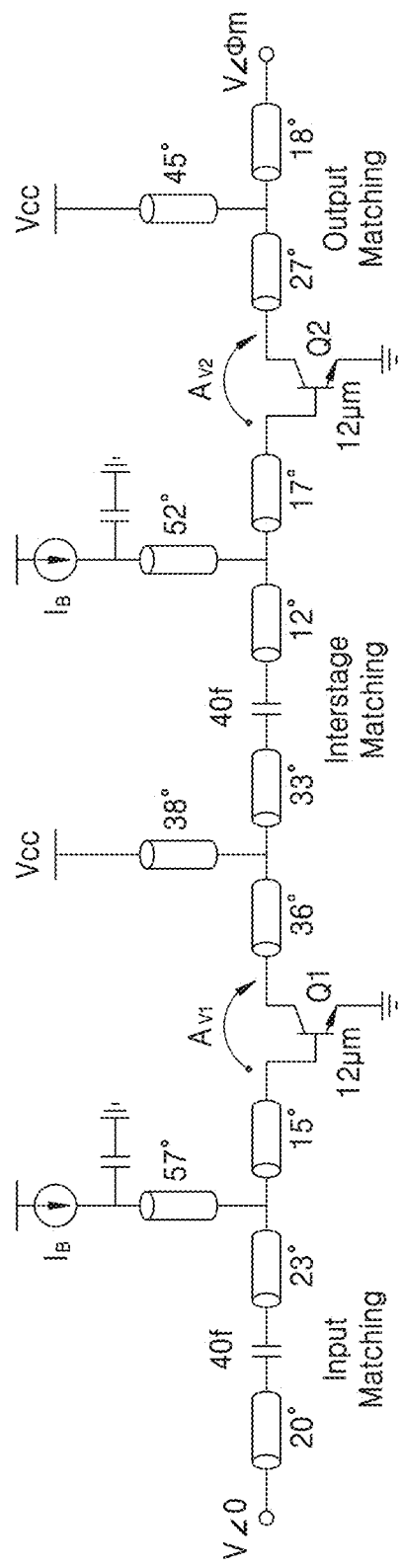
FIG. 5 illustrates a configuration of an amplification circuit connected between two adjacent ports of the electromagnetic wave radiator.

FIG. 5 illustrates a configuration of the amplification circuit 140 connected between two adjacent ports 131 of the electromagnetic wave radiator 100. Referring to FIG. 5, each amplification circuit 140 may include an input matching unit, an inter-stage matching unit, and an output matching unit. In addition, a first common-emitter transistor Q1 may be disposed between the input matching unit and the inter-stage matching unit, and a second common-emitter transistor Q2 may be disposed between the inter-stage matching unit and the output matching unit. The amplification circuits 140 of the electromagnetic wave radiator 100 may be formed, for example, on the semiconductor substrate 101 illustrated in FIG. 1.

According to an example embodiment, when gains of the first and second common emitter transistors Q1 and Q2 are respectively $A_{v1}$ and $A_{v2}$, and the first and second common emitter transistors Q1 and Q2 have the same optimum voltage gain (that is, $A_{v1}=A_{v2}=A_{OPT}$), oscillation having maximum RF power may be achieved. In the case the electromagnetic wave radiator 100 has, for example, eight ports 131, the input matching unit, the inter-stage matching unit, and the output matching unit in each amplification circuit 140 may be designed to have a phase difference of $\pi/4$. In addition, the input matching unit, the inter-stage matching unit, and the output matching unit in each two-stage amplification circuit 140 may be designed to suppress frequencies other than the resonance frequency.

Each of the amplification circuits 140 arranged in a loop shape in the electromagnetic wave radiator 100 having a rotationally symmetric structure may have the same port admittance. In addition, each of the port admittances may, for maintaining oscillation, have a negative resistance that can offset a cavity loading impedance at the resonant frequency. When a total admittance of the electromagnetic wave radiator 100 has a negative real part at the resonance frequency, the maximum oscillation power may be delivered to the cavity.

Figure 6:
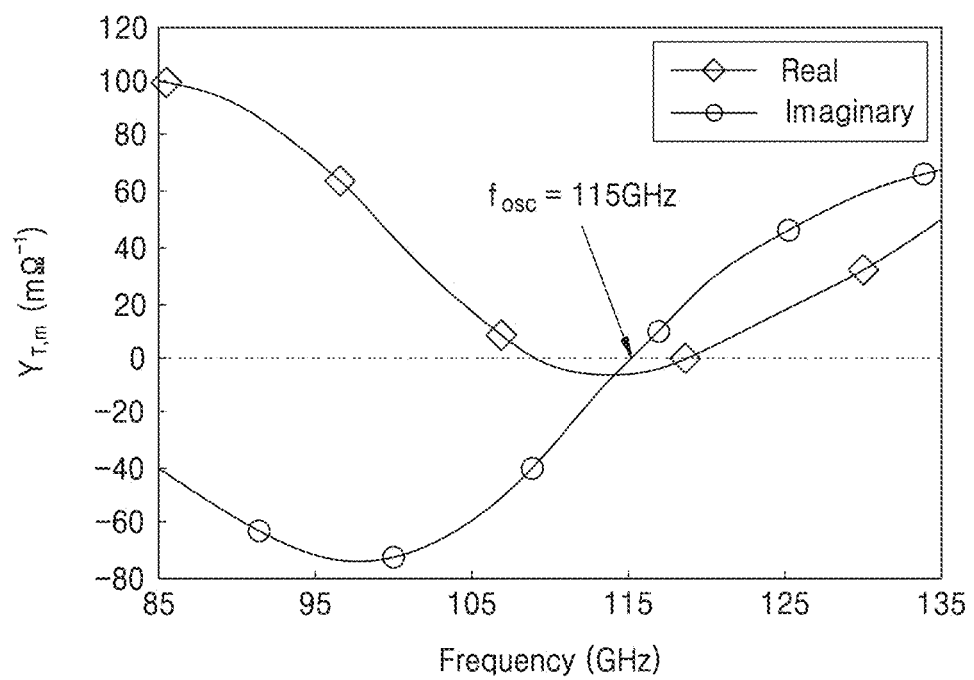
FIG. 6 is a graph illustrating frequency response characteristics of a real part and an imaginary part of the total admittance of the electromagnetic wave radiator.

For example, FIG. 6 is a graph showing frequency response characteristics of a real part and an imaginary part of the total admittance of the electromagnetic wave radiator 100. In the graph of FIG. 6, it is assumed that the electromagnetic wave radiator 100 has eight ports 131, there is a phase difference of $\pi/4$ between two adjacent ports 131, and the resonant frequency is about 115 GHz. Referring to FIG. 6, at the resonant frequency, the real part of the total admittance may be less than or equal to about 0 and the imaginary part may be equal to about 0. In addition, the real part of the total admittance is greater than about 0 at frequencies other than the resonant frequency.

Figure 7:
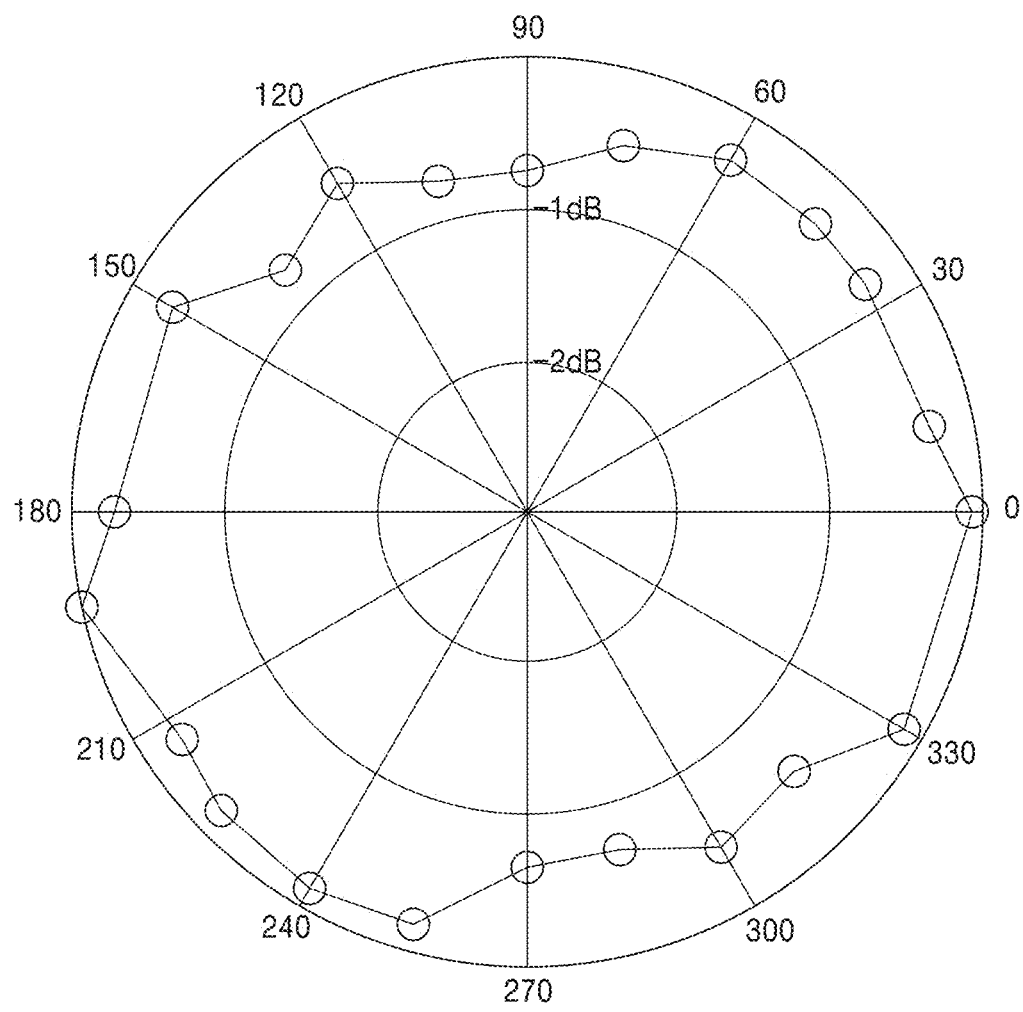
FIG. 7 is a graph illustrating a measurement result of a polarization pattern of an electromagnetic wave radiated from the electromagnetic wave radiator.
Figure 8:
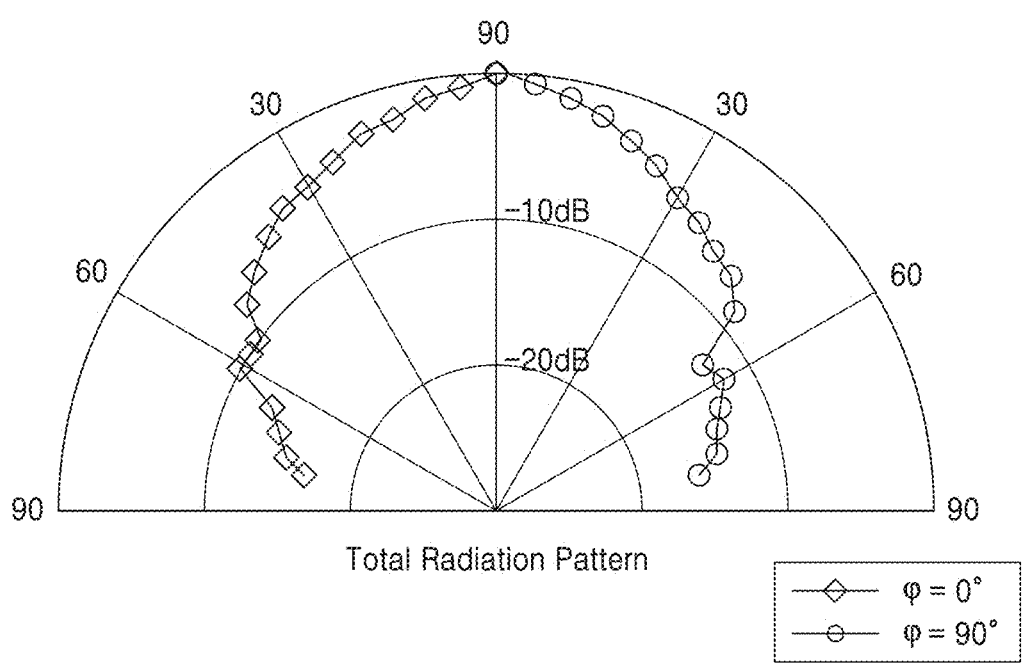
FIG. 8 is a graph illustrating a measurement result of a radiation pattern of an electromagnetic wave radiated from the electromagnetic wave radiator.

FIG. 7 is a graph showing a measurement result of a polarization pattern of an electromagnetic wave radiated from the electromagnetic wave radiator 100 and FIG. 8 is a graph showing a measurement result of a radiation pattern of an electromagnetic wave radiated from the electromagnetic wave radiator. The graph of FIG. 8 is the result measured in planes having two azimuth angles ϕ of 0° and 90°. As illustrated in the graph of FIG. 7, the polarization pattern of the electromagnetic wave radiated from the electromagnetic wave radiator 100 may be circularly-polarized light having an axial ratio better than about 0.8 dB. In addition, as illustrated in the graph of FIG. 8, the radiation pattern of the electromagnetic wave radiated from the electromagnetic wave radiator 100 may have a beam width of about 25° and be almost symmetrical with respect to a boresight.

Figure 9:
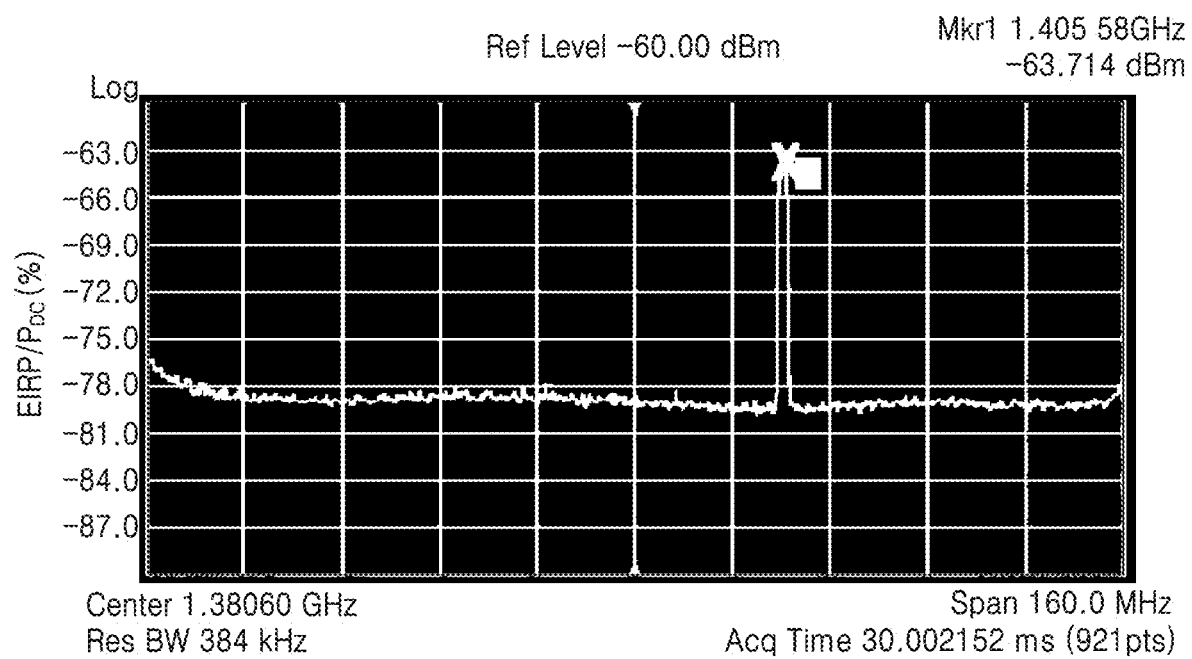
FIG. 9 is a graph illustrating a measurement result of spectral characteristics of an electromagnetic wave radiated from the electromagnetic wave radiator.
Figure 10:
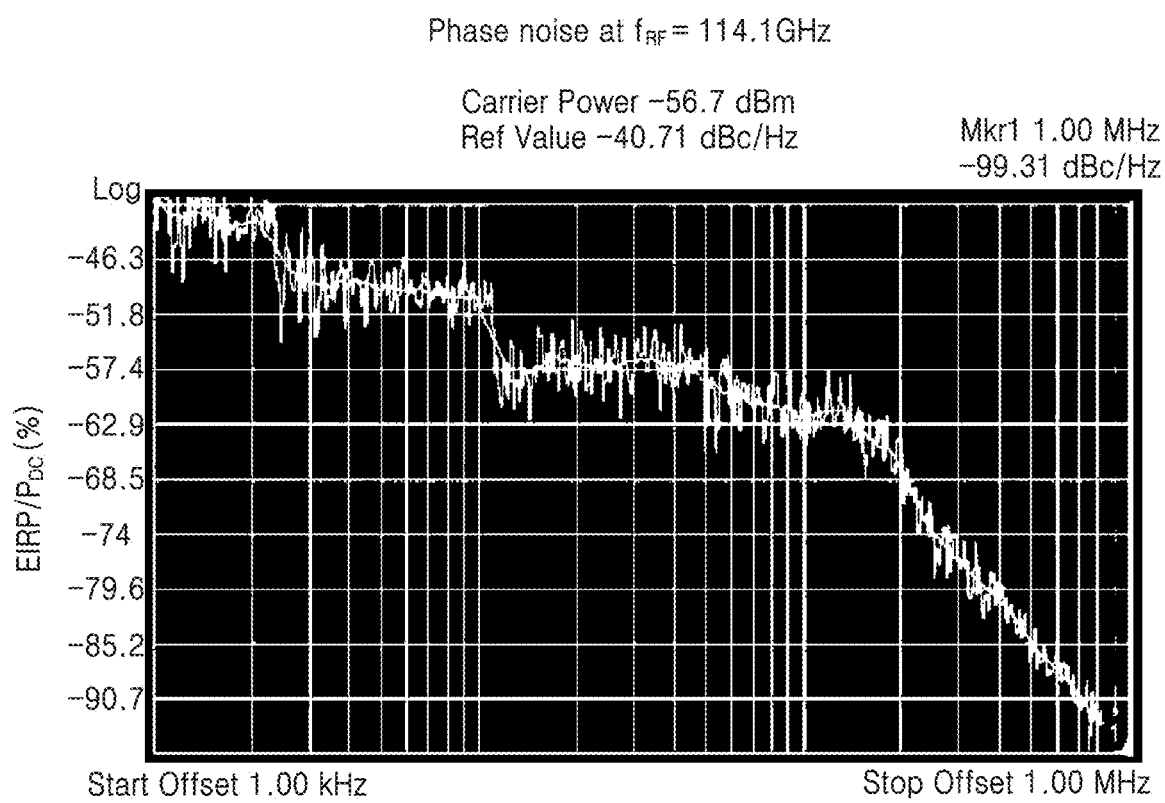
FIG. 10 is a graph illustrating a measurement result of phase noise characteristics of an electromagnetic wave radiated from the electromagnetic wave radiator.

FIG. 9 is a graph illustrating a measurement result of spectral characteristics of an electromagnetic wave radiated from the electromagnetic wave radiator 100, and FIG. 10 is a graph illustrating a measurement result of phase noise characteristics of an electromagnetic wave radiated from the electromagnetic wave radiator 100. Referring to FIG. 9, the electromagnetic wave radiated from the electromagnetic wave radiator 100 may have a peak at about 114.1 GHz. At the peak, the equivalent isotropically radiated power (EIRP) may be about 14 dBm, the EIRP/PDC may be about 5%, and the DC-to-RF efficiency may be about 3.7%. In addition, referring to FIG. 10, the electromagnetic wave radiator 100 may show phase noise of about −99.3 dBc/Hz@1 MHz offset. This low phase noise may be due to the high Q-factor through the cavity resonance of the electromagnetic wave radiator 100 and the noise reduction due to the power coupling of the ports through the cavity. In addition, even when a DC power greatly varies, the resonance frequency may be varied to less than about 1.3 GHz (about 1%) due to the high Q-factor resonance.

Figure 11A:
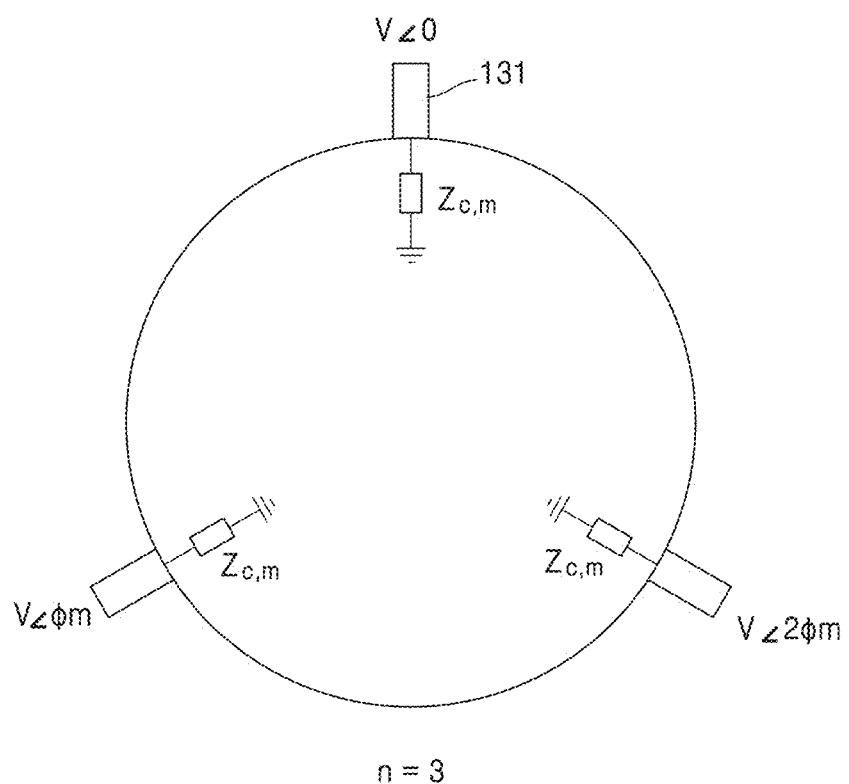
FIGS. 11A through 11E illustrate various example embodiments of the electromagnetic wave radiator.
Figure 11B:
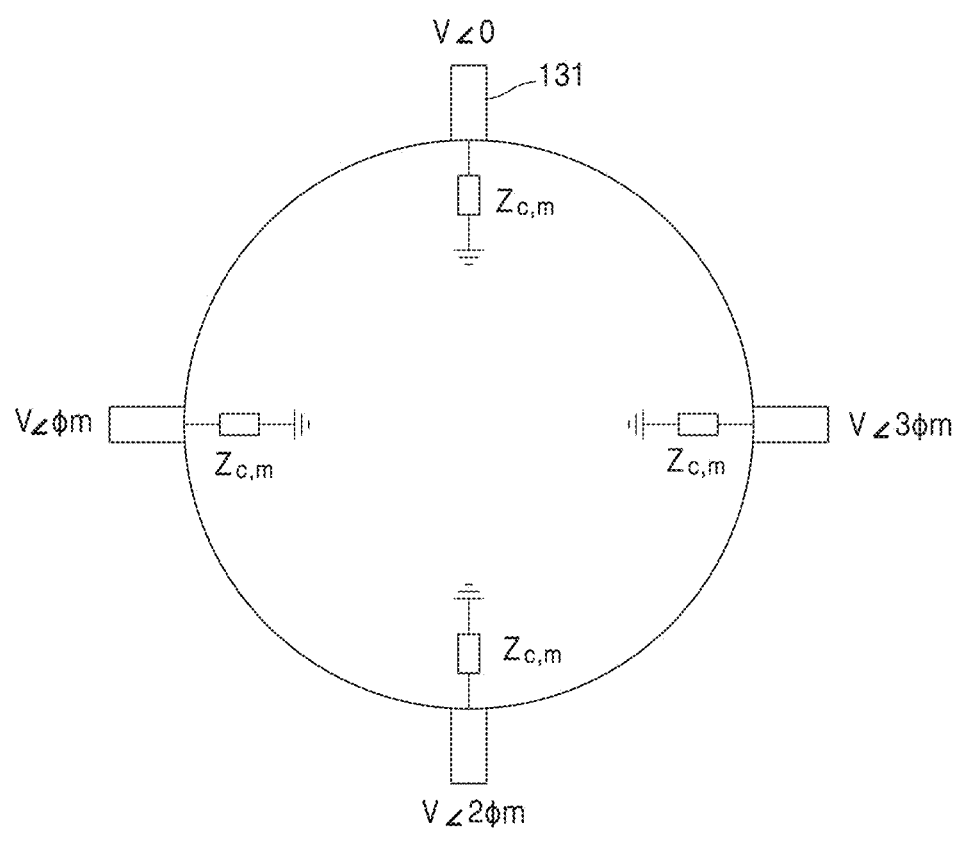
Figure 11C:
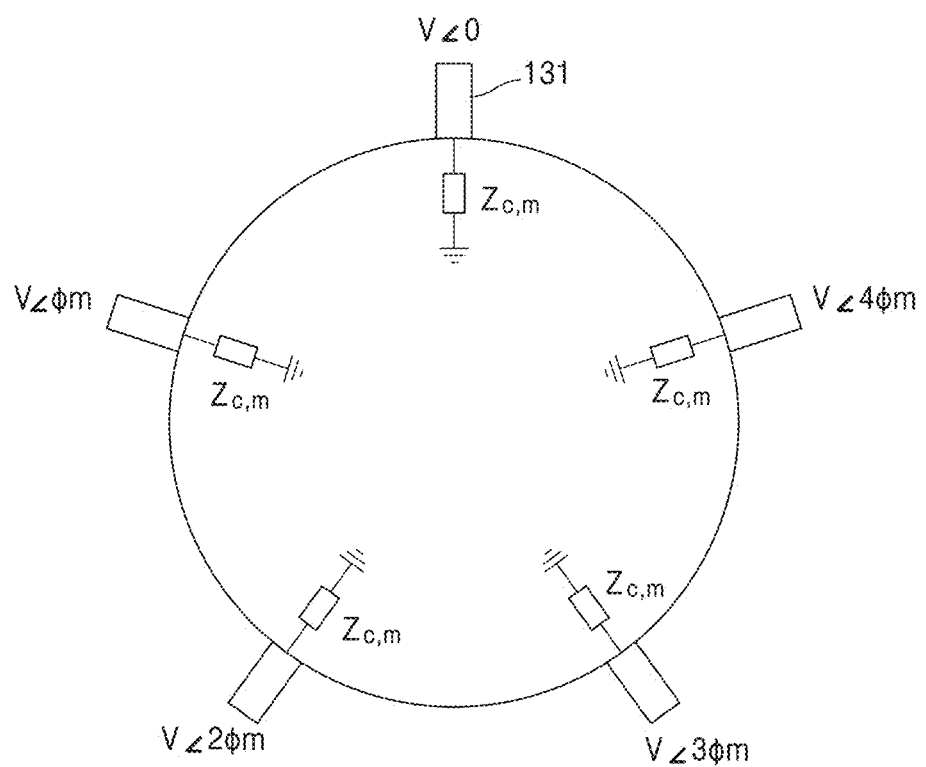
Figure 11D:
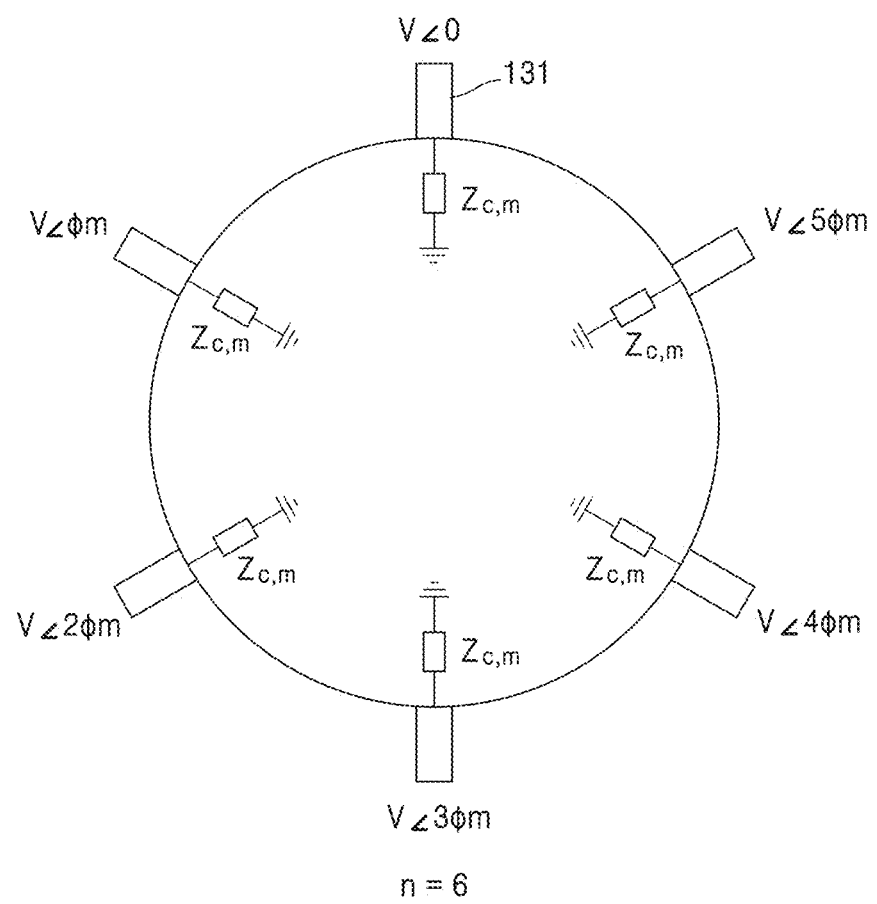
Figure 11E:
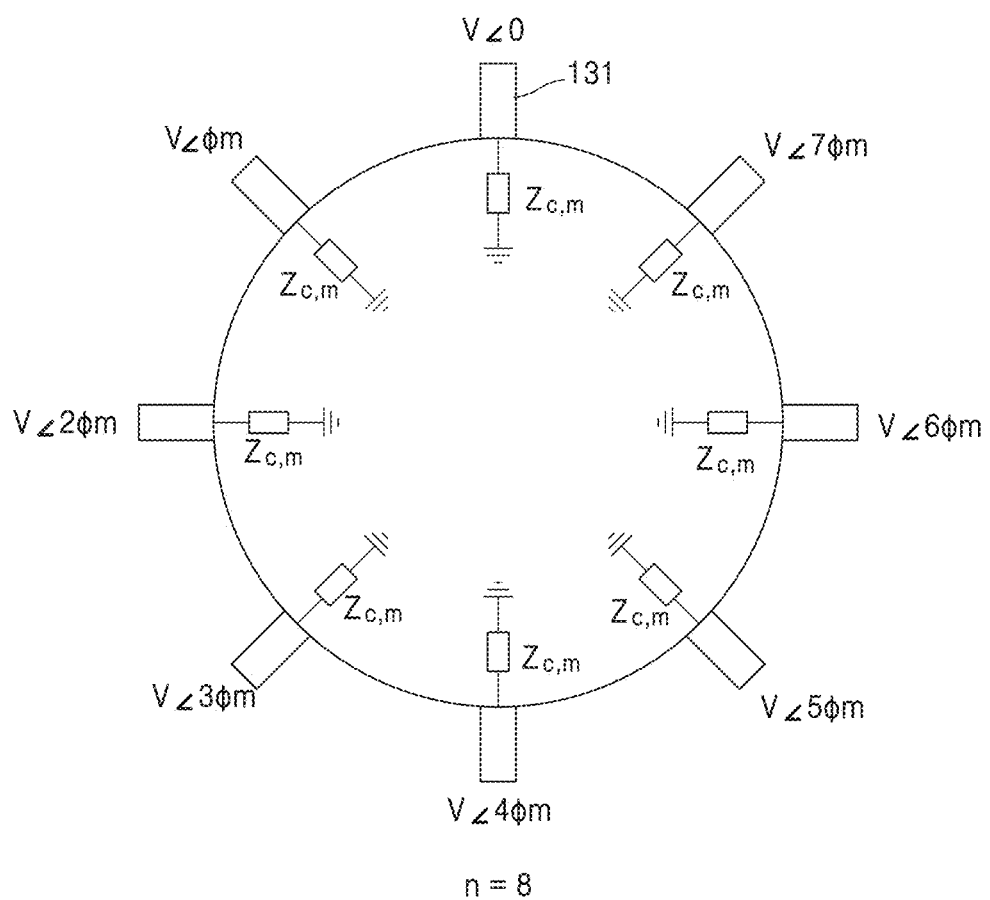

Hereto, the case has been described when the electromagnetic wave radiator 100 includes eight ports 131. However, example embodiments are not limited thereto. FIGS. 11A through 11E illustrate various example embodiments of the electromagnetic wave radiator 100. Referring to FIG. 11A, the electromagnetic wave radiator 100 may have three ports 131. In this case, the first metal layer 110 and the second metal layer 130 may have a circular or regular triangle shape. In addition, the phase difference between adjacent ports 131 may be $2\pi/3$. For example, a signal having a phase of about 0° may be applied to a port 131 at the 12 o'clock direction and signals having phases of 120° and 240° may be respectively applied to ports 131 in a counter-clockwise direction. In addition, as illustrated in FIG. 11B, the electromagnetic wave radiator 100 may have four ports 131. In this case, the first metal layer 110 and the second metal layer 130 may have a circular or square shape, and the phase difference between the adjacent ports 131 may be $\pi/2$. For example, a signal having a phase of about 0° may be applied to the port 131 at the 12 o'clock direction and signals having phases of 90°, 180°, 270° may be applied to respective ports 131. In addition, as illustrated in FIGS. 11C to 11E, the electromagnetic wave radiator 100 may have five, six, or eight ports 131. In addition, other numbers of ports 131 (e.g., seven, nine, ten, etc.) of the electromagnetic wave radiator 100 may be selected as necessary.

Figure 12A:
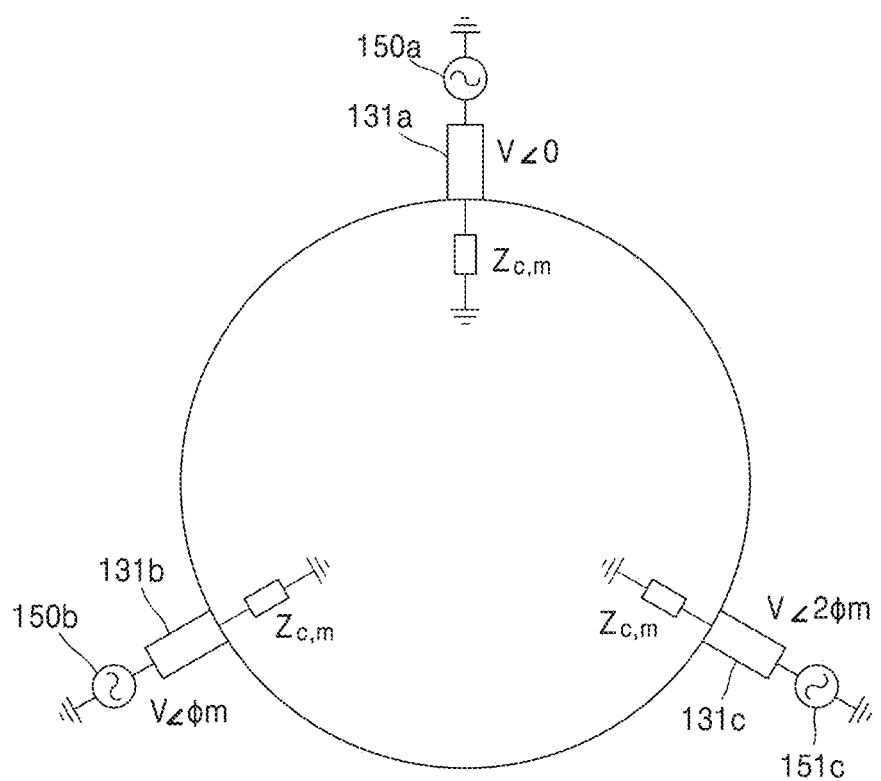
FIGS. 12A and 12B illustrate various example embodiments of a connection relationship between respective ports and oscillators of the electromagnetic wave radiator.
Figure 12B:
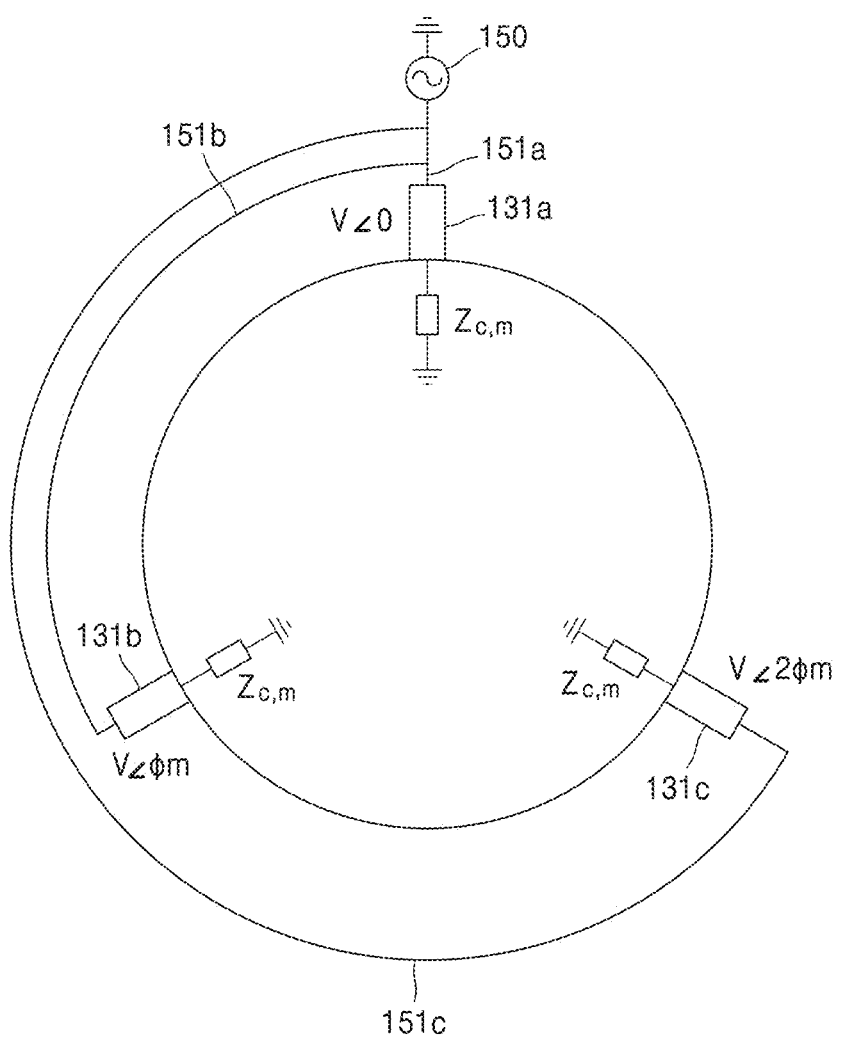

FIGS. 12A and 12B illustrate various example embodiments of a connection relationship between respective ports 131 and oscillators 150 of the electromagnetic wave radiator 100. As illustrated in FIG. 12A, the electromagnetic wave radiator 100 may include a plurality of oscillators 150a, 150b, and 150c, which are respectively connected to a plurality of ports 131a, 131b, and 131c. For example, when the electromagnetic wave radiator 100 has three ports 131a, 131b, and 131c, the electromagnetic wave radiator 100 may include three oscillators 150a, 150b, and 150c. In this case, the first oscillator 150a connected to the first port 131a may provide a signal having a phase of about 0°, and the second oscillator 150b connected to the second port 131b may provide a phase of about 120°, and a third oscillator 150c connected to the third port 131c may provide a signal having a phase of about 240°. The first through third oscillators 150a, 150b and 150c may be formed on the semiconductor substrate 101 illustrated in FIG. 1.

In addition, referring to FIG. 12B, the electromagnetic wave radiator 100 may include only one oscillator 150 connected to the plurality of ports 131a, 131b, and 131c. One oscillator 150 can supply signals to each of the plurality of ports 131a, 131b, and 131c via a first wire 151a, a second wire 151b, and a third wire 151c. In this case, phases of signals applied to the plurality of ports 131a, 131b, and 131c may be adequately delayed by adjusting electrical lengths of the first through third wires 151a through 151c. That is, the first through third wires 151a through 151c may have electrical lengths that provide different phase delays from each other. For example, when the electromagnetic wave radiator 100 has three ports 131a, 131b, and 131c, the electrical length of the second wire 151b connected to the second port 131b may be selected so as to have a phase delay of about 120° with respect to the first wire 151a. Likewise, the electrical length of the third wire 151c connected to the third port 131c may be selected so as to have a phase delay of 120° with respect to the second lead 151b connected to the second port 131b.

Figure 13:
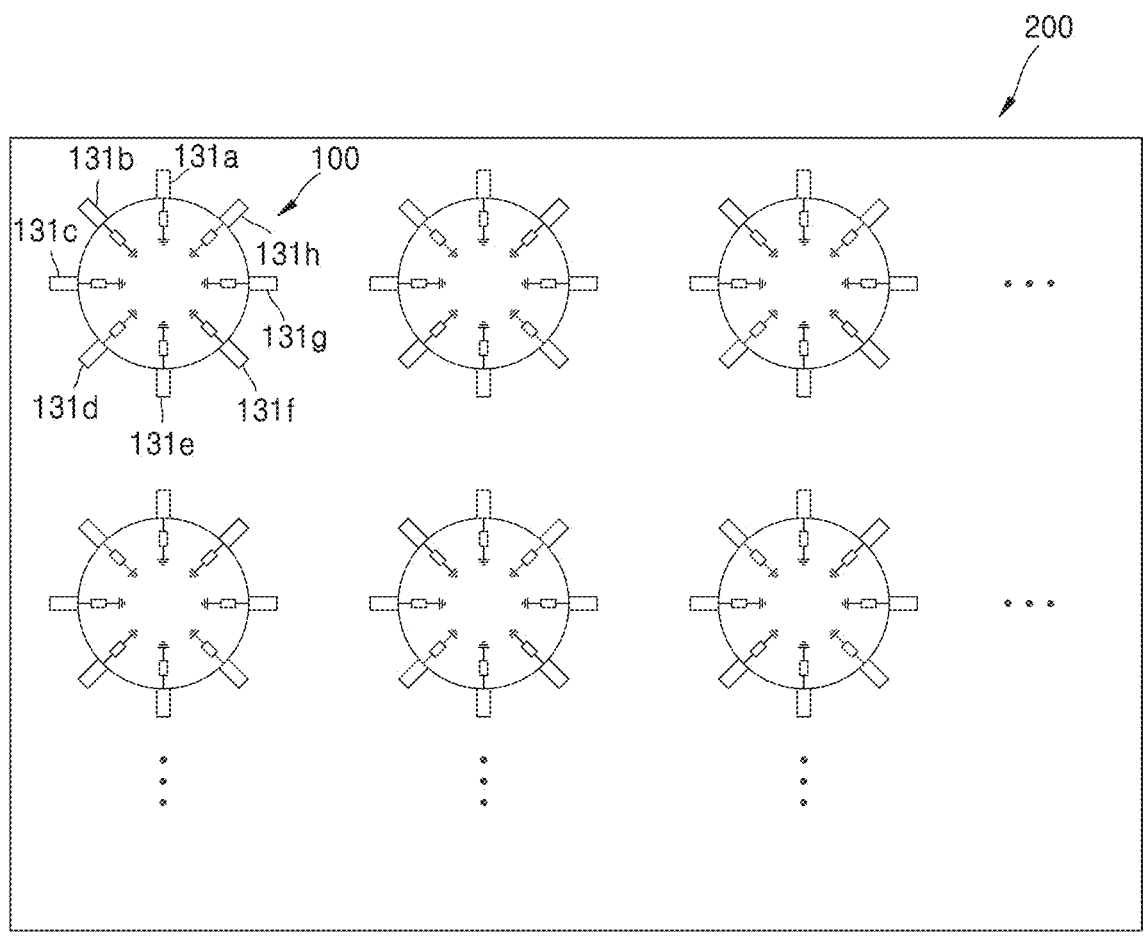
FIG. 13 illustrates an electromagnetic wave radiator array according to another example embodiment.

FIG. 13 illustrates an electromagnetic wave radiator array according to another example embodiment. Referring to FIG. 13, the electromagnetic wave radiator array 200 may include a plurality of two-dimensionally arranged electromagnetic wave radiators 100. The electromagnetic wave radiator array 200 may increase the overall power of the radiated millimeter-wave/THz-wave by using multiple electromagnetic wave radiators 100. In addition, the direction of a main lobe of the millimeter-wave/THz-wave may be adjusted via a beam steering technology. For example, when the phases of signals applied to a plurality of ports 131a through 131h are the same for all electromagnetic wave radiators 100 in the electromagnetic wave radiator array 200, the millimeter-wave/THz-wave may travel toward the front of the electromagnetic wave radiator array 200. For example, a signal having a phase of about 0° is applied to the first port 131a, a signal having a phase of about 45° is applied to the second port 131b, a signal having a phase of about 90° is applied to the port 131c, a signal having a phase of about 135° is applied to the fourth port 131d, a signal having a phase of about 180° is applied to the fifth port 131e, a signal having a phase of about 225° is applied to the sixth port 131f, a signal having a phase of about 270° is applied to the seventh port 131g, and a phase of about 315° is applied to the eighth port 131h, of all the electromagnetic wave radiators 100, the millimeter-wave/THz-wave may travel toward the front of the electromagnetic wave radiator array 200.

In addition, when the phase of the signal is slightly changed for each corresponding port of the plurality of electromagnetic wave radiators 100, a traveling direction of the millimeter-wave/THz wave may be changed to the right or left side or the up or down direction. For example, in FIG. 13, a signal having a phase of about 0° is applied to the first port 131a of the electromagnetic wave radiators 100 arranged on a first column from a left side, a signal having a phase of about 10° is applied to the first port 131a of the electromagnetic wave radiators 100 arranged on a second column from the left side, and a signal having a phase of about 20° is applied to the first port 131a of the electromagnetic wave radiators 100 arranged on a third column from the left side. In this case, signals having phases of about 55°, about 100°, about 145°, about 190°, about 235°, about 280°, and about 325° may be respectively applied to the second through eighth ports 131b through 131h of the electromagnetic wave radiators 100 arranged on the second column from the left side. In addition, signals having phases of about 65°, about 110°, about 155°, about 200°, about 245°, about 290°, and about 335° may be respectively applied to the second through eighth ports 131b through 131h of the electromagnetic wave radiators 100 arranged on the third column from the left side. Then, the millimeter-wave/THz-wave may have a tilted wave front when viewed toward the drawing and then, travel in the right direction.

It should be understood that embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. An antenna comprising:
a plurality of ports which are radially disposed;
a resonant cavity connected to the plurality of ports and configured to combine three or more signals, which have different phases from each other, applied via the plurality of ports; and
a plurality of slots for radiating an electromagnetic signal combined by the resonant cavity,
wherein the plurality of ports are disposed to protrude a side surface of the resonant cavity, and
wherein the plurality of slots are radially disposed on an upper surface of the resonant cavity.

2. The antenna of claim 1, wherein the three or more signals are combined with each other by being resonated in the resonant cavity.

3. The antenna of claim 1, wherein the three or more signals have an identical amplitude, and phase differences between signals applied via two adjacent ports are identical.

4. The antenna of claim 1, wherein the plurality of ports, the resonant cavity, and the plurality of slots are configured to function as a slot antenna, a resonant tank, a power combining network, and a radiator.

5. The antenna of claim 1, further comprising a plurality of amplification circuits disposed in a loop shape, each of the plurality of amplification circuits being disposed between two adjacent ports of the plurality of ports.

6. The antenna of claim 5, wherein each of the plurality of amplification circuits comprises an input matching unit, an inter-stage matching unit, an output matching unit, a first common emitter transistor between the input matching unit and the inter-stage matching unit, and a second common emitter transistor between the inter-stage matching unit and the output matching unit.

7. The antenna of claim 6, wherein the first common emitter transistor and the second common emitter transistor have an identical voltage gain.

8. The antenna of claim 1, port impedances for the plurality of ports are identical to each other, and port admittances for the plurality of ports are identical to each other.

9. The antenna of claim 8, each of the port admittances has a negative resistance offsetting a cavity load impedance at a resonant frequency of the resonant cavity, and a total admittance of the antenna has a negative real part at the resonant frequency.

10. The antenna of claim 1, wherein the plurality of ports are spaced apart from each other in an angular direction and each of the plurality of ports extends a radial direction, and
the plurality of slots are spaced apart from each other in an angular direction and each of the plurality of slots extends in a radial direction.

11. The antenna of claim 10, wherein one port of the plurality of ports and one slot of the plurality of slots corresponding to the one port of the plurality of ports extend in a line.

12. The antenna of claim 1, wherein the antenna has a radially symmetric structure such that the antenna is configured to radiate a circularly-polarized millimeter-wave/terahertz (THz) wave.

13. An antenna comprising:
a plurality of ports which are radially disposed;
a resonant cavity connected to the plurality of ports and configured to combine three or more signals, which have different phases from each other, applied via the plurality of ports; and
a plurality of slots for radiating an electromagnetic signal combined by the resonant cavity,
wherein the resonant cavity comprises:
a first metal layer;
a plurality of metal side walls vertically protruding along an edge of the first metal layer; and
a second metal layer suspended over the first metal layer,
wherein the second metal layer comprises the plurality of ports extending radially from edges of the second metal layer and the plurality of slots penetrating the second metal layer in a radial direction,
wherein the resonant cavity is defined as a space surrounded by the first metal layer, the plurality of side walls, and the second metal layer.

14. The antenna of claim 13, wherein every pair of adjacent metal side walls of the plurality of metal side walls is spaced apart from each other, and each port of the plurality of ports is disposed to pass through a gap between a corresponding pair of adjacent metal side walls.

15. The antenna of claim 13, wherein the second metal layer is surrounded by the plurality of metal side walls.

16. The antenna of claim 13, wherein the second metal layer further comprises an opening penetrating through a central region of the second metal layer.

17. The antenna of claim 13, wherein each of the plurality of slots is positioned between a respective portion of the second metal layer and the center portion of the second metal layer.

18. An electromagnetic wave radiator comprising:
a plurality of ports which are radially disposed;
a resonant cavity connected to the plurality of ports and configured to combine three or more signals, which have different phases from each other, applied via the plurality of ports;
a plurality of slots for radiating an electromagnetic signal combined by the resonant cavity; and
at least one oscillator configured to provide the three or more signals to each of the plurality of ports,
wherein the plurality of ports are disposed to protrude a side surface of the resonant cavity, and
wherein the plurality of slots are radially disposed on an upper surface of the resonant cavity.

19. The electromagnetic wave radiator of claim 18, wherein the at least one oscillator is configured so that the three or more signals provided to the plurality of ports have an identical amplitude and different phases from each other, and phase differences between signals applied to two adjacent ports are identical.

20. The electromagnetic wave radiator of claim 18, wherein the plurality of ports has n ports, and a phase of the signal applied to an m-th port is $2m\pi/n$, where n is a natural number and m is $0, 1, \ldots, n-1$.

21. The electromagnetic wave radiator of claim 18, wherein the at least one oscillator is connected to the plurality of ports in a one-to-one manner.

22. The electromagnetic wave radiator of claim 18, wherein one oscillator of the at least one oscillator is connected to the plurality of ports via a plurality of wires and each of the plurality of wires has an electrical length providing a different phase delay from each other.

* * * * *